United States Patent
Sawada

(10) Patent No.: US 8,369,167 B2
(45) Date of Patent: Feb. 5, 2013

(54) SEMICONDUCTOR MEMORY DEVICE AND METHOD OF TESTING A SENSE AMPLIFIER OF THE SAME

(75) Inventor: Tomohiro Sawada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 159 days.

(21) Appl. No.: 12/984,217

(22) Filed: Jan. 4, 2011

(65) Prior Publication Data

US 2011/0164464 A1 Jul. 7, 2011

(30) Foreign Application Priority Data

Jan. 5, 2010 (JP) ................................ 2010-000467

(51) Int. Cl.
*G11C 29/02* (2006.01)

(52) U.S. Cl. ........ 365/201; 365/200; 365/196; 365/208; 365/207; 365/225.7; 365/189.15; 365/189.16; 365/189.07; 365/222

(58) Field of Classification Search .................. 365/200, 365/201, 196, 193, 205, 208, 207, 225.7, 365/189.14, 189.15, 189.16, 189.07, 222
See application file for complete search history.

(56) References Cited

U.S. PATENT DOCUMENTS

| 6,934,214 | B2* | 8/2005 | Fujisawa et al. ......... 365/230.03 |
| 7,466,612 | B2* | 12/2008 | Shim ............................ 365/201 |

FOREIGN PATENT DOCUMENTS

| JP | 2007-080515 A | 3/2007 |
| JP | 2011-141912 A | * 7/2011 |

* cited by examiner

*Primary Examiner* — Andrew Q Tran
(74) *Attorney, Agent, or Firm* — Sughrue Mion, PLLC

(57) ABSTRACT

A semiconductor device includes the following elements. A sense amplifier amplifies signal on a bit line. A column switch is between the bit line and a local input-output line. A sub-amplifier amplifies signal on the local input-output line. A write switch is between the local input-output line and a main input-output line. A write amplifier amplifies write data and supplies the amplified write data to the main input-output line when data write operation is performed. A test circuit activates the sense amplifier while the test circuit deactivating the sub-amplifier and the write amplifier when a data read operation is performed in test mode. The test circuit places the column switch and the write switch in conductive state.

20 Claims, 5 Drawing Sheets

US 8,369,167 B2

SEMICONDUCTOR MEMORY DEVICE AND METHOD OF TESTING A SENSE AMPLIFIER OF THE SAME

BACKGROUND OF THE INVENTION

1. Field of the Invention

The present invention relates to a semiconductor memory device and a method of testing the same, and more particularly, to a semiconductor memory device in which a test circuit for an operation/function test is integrated and a method of testing the same.

Priority is claimed on Japanese Patent Application No. 2010-000467, Jan. 5, 2010, the content of which is incorporated herein by reference.

2. Description of the Related Art

In semiconductor memory devices such as DRAMs, data is input/output in parallel by a number of input/output terminals. When data is input to some input/output terminals, an unused input/output terminal is masked to prevent data from being input to the unused input/output terminal. In particular, a write mask operation is known, in which specific bits are not written during a write operation. Japanese Unexamined Patent Application, First Publication No. JP-A-2007-80515 discloses the write mask operation. In the write mask operation, data is prevented from being written to a memory cell by deactivating a write amplifier and a sub-amplifier connected to an input/output terminal which has received no input of data.

FIG. 5 is a diagram illustrating a schematic configuration from a write amplifier, which amplifies data to be written, to a pair of bit lines BL and /BL. When the write mask operation is performed, a write amplifier 121A is deactivated and its output is in a high impedance state. A sub-amplifier SUB is also deactivated. The sub-amplifier is connected to local input/output lines LIO (local I/O lines) branched from main input/output lines MIO (main I/O lines). However, an operation other than those of the write amplifier 121A and the sub-amplifier SUB is the same as a normal data write operation. That is, a Y switch YS and a write switch WS are placed in conductive state, and a sense amplifier SA is also activated. Accordingly, the sense amplifier SA amplifies data on the bit lines BL and /BL, the data having been read out of selected memory cells (not shown). However, the local input/output line LIO and the main input/output line MIO are also connected to the bit line BL. That is, the sense amplifier SA needs to drive the local input/output line LIO and the main input/output line MIO in accordance with a potential of the bit line BL. When the normal write operation, not the write mask operation, is performed, the potential of the bit line BL is determined by the write amplifier 121 in accordance with data to be written. The data is written to a selected memory cell.

When the write mask operation is performed, the main input/output line MIO and the local input/output line LIO as well as the bit line BL are connected to the sense amplifier SA. Hence, a load is maximized for the sense amplifier SA. Thus, if the load driving capability of the sense amplifier SA is less than a predetermined capability due to the variation of a fabrication process or the like, it is impossible to amplify data of the selected memory cell appearing on the bit line BL without any error.

In a screening process after assembly, a write mask operation test is also performed. A semiconductor memory device in which a defective sense amplifier SA is formed (that is, load driving capability of the sense amplifier SA is low) is detected as a defective product.

SUMMARY

In one embodiment, a semiconductor device may include, but is not limited to, the following elements. A sense amplifier amplifies signal on a bit line. A column switch is between the bit line and a local input-output line. A sub-amplifier amplifies signal on the local input-output line. A write switch is between the local input-output line and a main input-output line. A write amplifier amplifies write data and supplies the amplified write data to the main input-output line when data write operation is performed. A test circuit activates the sense amplifier while the test circuit deactivating the sub-amplifier and the write amplifier when a data read operation is performed in test mode. The test circuit places the column switch and the write switch in conductive state.

In another embodiment, a method of testing a semiconductor device may include, but is not limited, performing a read operation of the semiconductor device in a test mode. Performing the read operation may include the following processes. A first sense amplifier which amplifies signal on a bit line is activated. A sub-amplifier is deactivated. The sub-amplifier amplifies signal on a local input-output line that is connected through a column switch to the bit line. A write amplifier is deactivated. The write amplifier drives a main input-output line based on write data signal. The main input-output line is connected through a write switch to the local input-output line. A column switch and a write switch are placed in conductive state.

In still another embodiment, a method of testing a semiconductor device may include, but is not limited to, the following processes. Test data is written to a memory cell, the memory cell being coupled to a bit line, a main input-output line, and a local input-output line. Data is read out from the memory cell to the bit line. A first sense amplifier is allowed to amplify the data on the bit line, while the first sense amplifier is electrically coupled to the bit line, the main input-output line, and the local input-output line. The data amplified by the first sense amplifier is compared to a reference data describing the test data.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
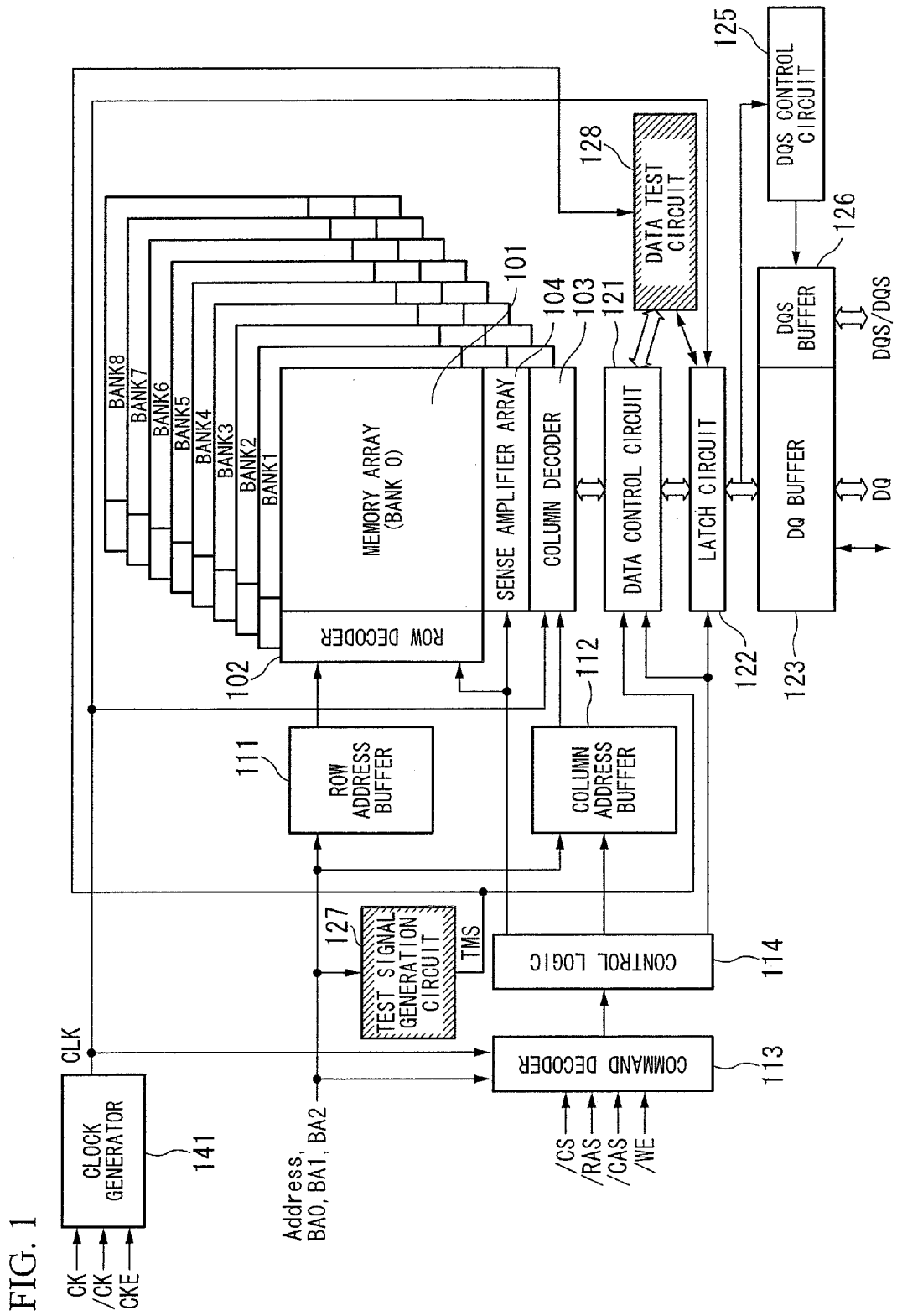
FIG. 1 is a block diagram showing the entire configuration in accordance with one embodiment of the present invention.

Before describing the present invention, the related art will be explained in detail, with reference to drawings, in order to facilitate the understanding of the present invention.

Besides the screening process after assembly as the test for the semiconductor memory device, there is a test for a semiconductor device on a semiconductor wafer (referred to as a pellet on wafer (P/W) test). However, the write mask operation test is not supported in a test device (a P/W tester), which performs the P/W test. That is, it is necessary to use a data mask pin for the write mask operation test, but the P/W tester is not provided with a probe (a test needle) to be connected to the data mask pin. Actually, the write mask operation test is performed in the screening process after assembly. If any defectiveness of a sense amplifier is found by a write mask test in the screening process after assembly, the semiconductor memory device should be discarded as a defective product. This is because the semiconductor memory device may not be repaired by a laser fuse after assembly if a corresponding circuit has a laser fuse configuration even when the semiconductor memory device is provided with a redundancy circuit for repair of a defective address.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, the following elements. A sense amplifier amplifies signal on a bit line. A column switch is between the bit line and a local input-output line. A sub-amplifier amplifies signal on the local input-output line. A write switch is between the local input-output line and a main input-output line. A write amplifier amplifies write data and supplies the amplified write data to the main input-output line when data write operation is performed. A test circuit activates the sense amplifier while the test circuit deactivating the sub-amplifier and the write amplifier when a data read operation is performed in test mode. The test circuit places the column switch and the write switch in conductive state.

In some cases, the test circuit may include, but is not limited to, the following elements. A test signal generation circuit generates a test signal for performing a test operation in the test mode. A data test circuit performs the test operation in the test mode in response to the test signal.

In some cases, the data test circuit may include, but is not limited to, the following elements. A test data copy unit copies input data to generate a plurality of write test data when the write amplifier stores the test data to selected memory cells. A write mask unit deactivates the write amplifier and the sub-amplifier when the data read operation is performed in test mode. The write mask unit places the write switch in conductive state. A test data logical operation unit compares write data in each of the selected memory cells and read data from the each memory cell. The test data logical operation unit generates determination information indicating whether or not the sense amplifier is defective, based on a result of comparing the read data to the write data.

In some cases, the semiconductor device may further inclu0de, but is not limited to, the following elements. A plurality of data terminals are provided. A write mask unit masks a part of the plurality of data terminals while the write mask unit allowing the write amplifier to store data to a rest other than the part of the plurality of data terminals.

In some cases, the semiconductor device may further include, but is not limited to, the following elements. A plurality of data terminals are provided. A write mask unit masks a part of the plurality of data terminals while the write mask unit allowing the write amplifier to store data to a rest other than the part of the plurality of data terminals.

In some cases, the semiconductor device may further include, but is not limited to, the following elements. A plurality of the write amplifiers correspond to the plurality of data terminals. A plurality of the main input-output lines correspond to the plurality of the write amplifiers. Plural sets of the local input-output lines are provided. Each of the plural sets includes a plurality of the local input-output lines. The plural sets correspond to the plurality of the main input-output lines. A plurality of the sense amplifiers correspond to the plural sets.

In some cases, the semiconductor device may include, but is not limited to, the test circuit deactivating the plurality of the write amplifiers in test mode while the test circuit controls selected sense amplifiers to drive the plurality of main input-output lines and the plurality of local input-output lines electrically connected to the plurality of main input-output lines.

In some cases, the semiconductor device may include, but is not limited to, the selected sense amplifiers driving the plurality of main input-output lines and the plurality of local input-output lines, using data from the plurality of the memory cells.

In some cases, the semiconductor device may include, but is not limited to, a plurality of the sub-amplifiers corresponding to the plurality of local input-output lines. The test circuit deactivates each of the plurality of sub-amplifiers in the test mode.

In some cases, the semiconductor device may further include, but is not limited to, a plurality of the write switches. The test circuit deactivates the write amplifiers corresponding to the part of the plurality of data terminals which is masked by the write mask unit. The test circuit places, in non-conductive state, a part of the plurality of write switches, the part of the plurality of write switches correspond to the part of the plurality of data terminals which is masked by the write mask unit.

In another embodiment, a method of testing a semiconductor device may include, but is not limited, performing a read operation of the semiconductor device in a test mode. Performing the read operation may include the following processes. A first sense amplifier which amplifies signal on a bit line is activated. A sub-amplifier is deactivated. The sub-amplifier amplifies signal on a local input-output line that is connected through a column switch to the bit line. A write amplifier is deactivated. The write amplifier drives a main input-output line based on write data signal. The main input-output line is connected through a write switch to the local input-output line. A column switch and a write switch are placed in conductive state.

In some cases, performing the test mode may further include, but is not limited to, the following processes. External input data is copied to generate a plurality of write test data when the write amplifier stores the test data to selected memory cells. The write amplifier and the first sense amplifier are deactivated in data read operation in test mode. The write switch is placed in conductive state. Data is read out from the selected memory cells. Read data is compared to write data. The read data has been read out of each of the selected memory cells after the write data has been stored into the each memory cell.

In some cases, performing the test mode may further include, but is not limited to, generating determination information indicating whether or not the first sense amplifier is defective, based on a result of comparing the read data to the write data.

In some cases, performing the test mode may further include, but is not limited to, the following processes. A defective address is stored in a fuse circuit of a redundancy circuit when the first sense amplifier is determined as defective. The first sense amplifier is replaced to a redundancy cell and a second sense amplifier.

In some cases, the method may further include, but is not limited to, performing the test mode in a state where the semiconductor device is formed on a wafer.

In still another embodiment, a method of testing a semiconductor device may include, but is not limited to, the following processes. Test data is written to a memory cell, the memory cell being coupled to a bit line, a main input-output line, and a local input-output line. Data is read out from the memory cell to the bit line. A first sense amplifier is allowed to amplify the data on the bit line, while the first sense amplifier is electrically coupled to the bit line, the main input-output line, and the local input-output line. The data amplified by the first sense amplifier is compared to a reference data describing the test data.

In some cases, the method may further include, but is not limited to, generating determination information indicating whether or not the first sense amplifier is defective, based on a result of comparing the data amplified by the first sense amplifier to the reference data describing the test data.

In some cases, the method may further include, but is not limited to, the following processes. A defective address is stored in a fuse circuit of a redundancy circuit when the first sense amplifier is determined as defective. The first sense amplifier is replaced to a redundancy cell and a second sense amplifier.

In some cases, the method may include, but is not limited to, the following processes. A write switch is placed in conductive state and a sub-amplifier is placed in non-conductive state when amplifying the data on the bit line by the sense amplifier. The sub-amplifier amplifies signal of the local input-output line. The main input-output line is connected to the local input-output line through the write switch.

In some cases, the method may include, but is not limited to, the test mode being performed in a state where the semiconductor device is a wafer.

In some cases, the method may include, but is not limited to, performing a refresh operation of the memory cell by amplifying the data on the bit line by the first sense amplifier.

Hereinafter, in one embodiment, a DRAM (Dynamic Random Access Memory) as the semiconductor device will be described. In the drawings used for the following description, to facilitate understanding of the embodiments, illustrations are partially enlarged and shown, and the sizes and ratios of constituent elements are not limited to being the same as the actual dimensions. Materials, sizes, and the like exemplified in the following description are just examples, and the invention is not limited thereto and may be appropriately modified within the scope which does not deviate from the embodiments.

FIG. 1 is a block diagram showing the entire configuration of a semiconductor memory device according to an embodiment of the present invention, and shows an example of a synchronous DRAM (SDRAM). The configuration of the semiconductor memory device shown in FIG. 1 will be described. Referring to the semiconductor memory device of FIG. 1, memory arrays include memory arrays 101 of banks 0 to 8. In each memory array 101, a memory cell, which is an information storage unit, is arranged at an intersection of a word line and a bit line. The memory cell includes one NMOS transistor (a selection Tr) and a capacitor C connected to a source of the NMOS transistor in serial (see FIG. 2).

Control input signals are a chip select signal /CS, a row address strobe signal /RAS, a column address strobe signal /CAS, and a write enable signal /WE. Here, "/" represents an overbar of a logic symbol indicating that a low level is an active level.

An address signal Address and bank address signals BA0, BA1, and BA2 are supplied sequentially from outside to the semiconductor memory device in synchronization with external clock signals CL and /CL. On the basis of the address signal Address and the bank address signals BA0, BA1, and BA2, a row address signal is latched in a row address buffer 111, and a column address is latched in a column address buffer 112. The control input signals /CS, /RAS, /CAS, and /WE are supplied to a command decoder 113. The command decoder 113 decodes the control input signal (a read/write command or the like), and the decoded result is supplied to a control logic 114. On the basis of a signal of the decoded result output from the command decoder 113, the control logic 114 outputs a control signal to a circuit of each of a read system and a write system.

The row address signal latched in the row address buffer 111 is supplied to a row decoder 102 of the memory array 101 corresponding to the bank address signals BA0, BA1, and BA2. In the row decoder 102, a selection signal of a word line WL (see FIG. 2) is generated by the signal input from the row address buffer 111.

The column address signal latched in the column address buffer 112 is supplied to a column decoder 103 of the memory array 101 corresponding to the bank address signals BA0, BA1, and BA2. In the column decoder 103, a selection signal of a bit line BL (see FIG. 2) is generated by the signal input from the column address buffer 112.

Figure 5:
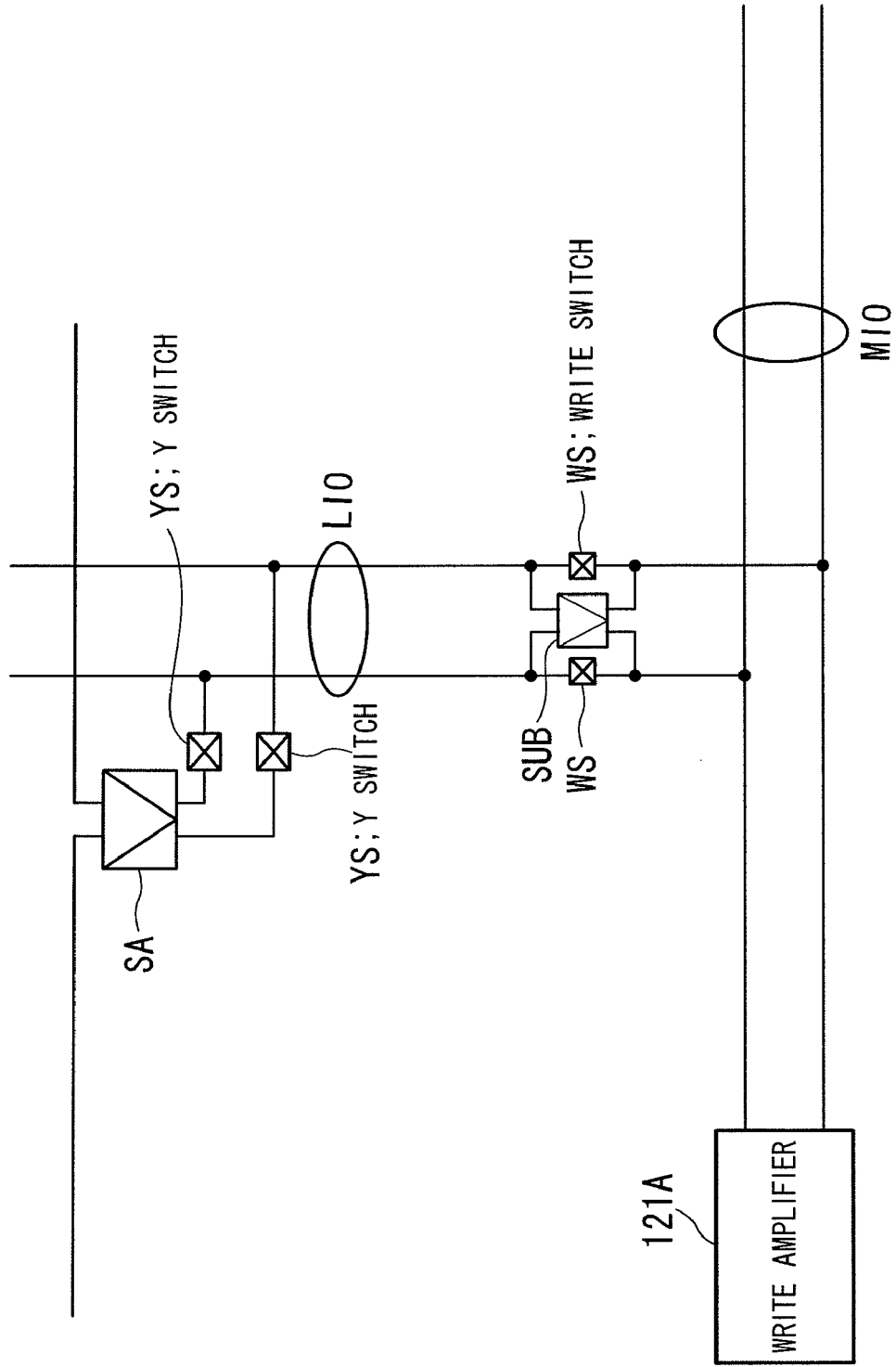
FIG. 5 is a diagram illustrating a schematic configuration in accordance with related art of the present invention.

If data is read from memory cells, read signals from the memory cells are supplied onto bit lines BL (more accurately, complementary bit lines BL and /BL, see FIG. 5) by selecting word lines WL by the row decoder 102 and by selecting bit lines BL by the column decoder 103. A sense amplifier SA within a sense amplifier array 104 performs an operation of amplifying signals of the bit lines BL. Returning to FIG. 1, storage information of a memory cell amplified by the sense amplifier SA is latched in a latch circuit 122 through a data control circuit 121. The latched data as a data signal DQ is output from a DQ buffer 123 of the semiconductor memory device.

If data is written to a memory cell, the memory cell to which the data is written is selected by selecting a word line WL by the row decoder 102 and by selecting a bit line BL by the column decoder 103. In response to the write data signal DQ, data is supplied via the DQ buffer 123 to the latch circuit 122. The data is then held in the latch circuit 122. The data is then supplied onto the bit line BL via the data control circuit 121, so that the data is written to the selected memory cell.

A DQS control circuit 125 is a circuit that generates a strobe signal for the data signal DQ. A DQS buffer 126 generates data strobe signals DQS and /DQS on the basis of the strobe signal generated by the DQS control signal 125. The data strobe signals DQS and /DQS function as reference clocks of the data signal DQ. A clock generator 141 generates an internal clock signal CLK synchronized with clock signals CK and /CK. A signal CKE input to the clock generator 141 is a clock enable signal for activating the clock generator 141.

Figure 2:
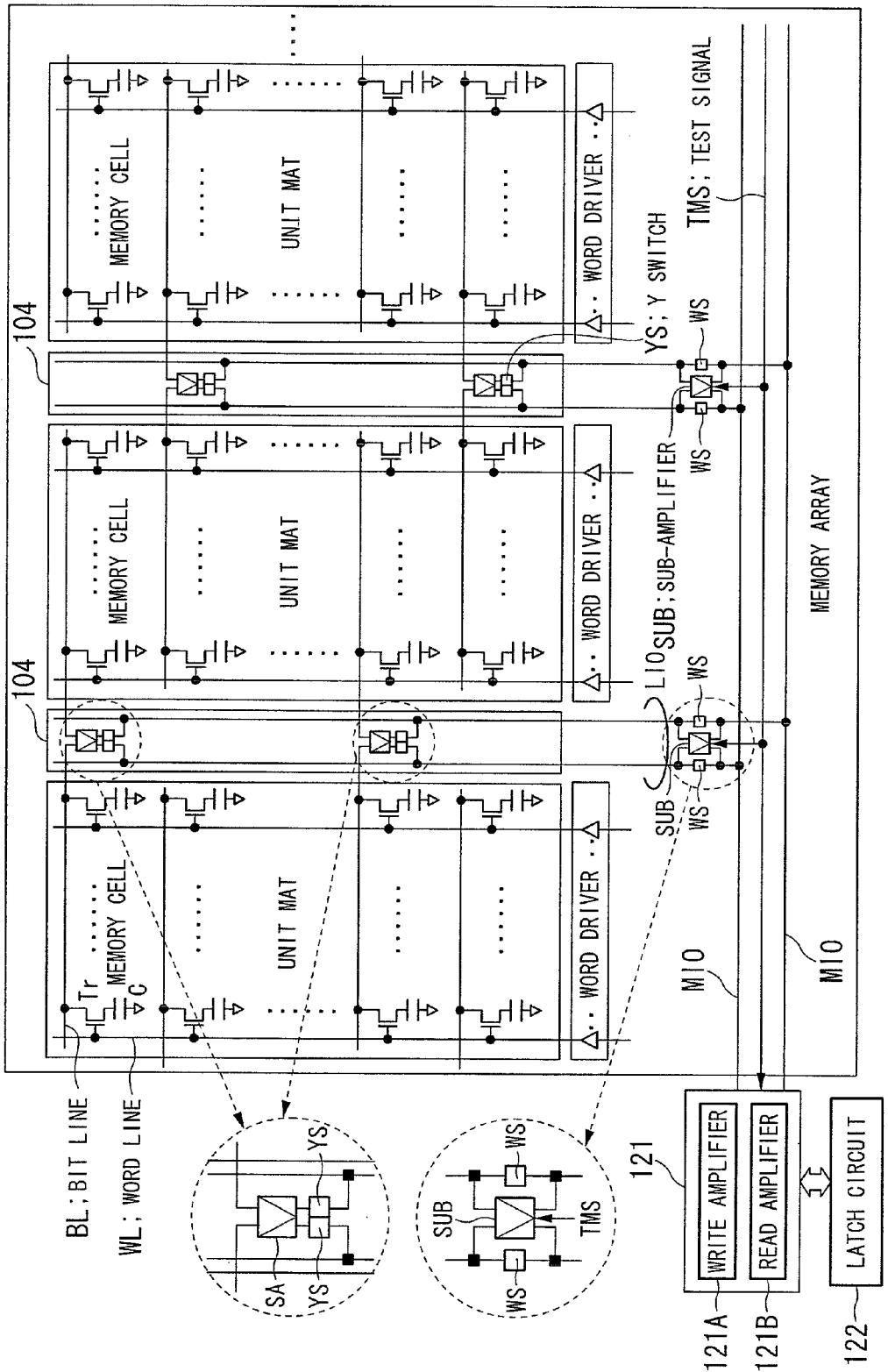
FIG. 2 is a diagram illustrating a schematic configuration in accordance with one embodiment of the present invention.

A test signal generation circuit 127 generates a test signal TMS (a test mode signal) in accordance with a signal supplied from outside of the semiconductor device. Then, the test signal generation circuit 127 supplies the test signal TMS to the data control circuit 121 and a data test circuit 128. Specifically, a P/W tester sets the test mode to the command decoder 113 using the control input signals /CS, /RAS, /CAS, and /WE. At that time, P/W tester designates a type of test to be performed using the address signal Address. In this embodiment, the type of test to be performed includes a test data write mode, a test data read mode, and a write mask test mode. In the test data write mode, test data is written to a selected memory cell. In a test data read mode, data is read out from the selected memory cell. The write mask test mode is different from a write mask in an actual operation. In the write mask test mode to be described later, basically, test data is written to a selected memory, and data is read from the selected memory. However, in a data read operation, control of the write amplifier 121A, the sub-amplifier SUB, and the write switch WS shown in FIG. 2 is set different from that of the test data read mode. The test signal generation circuit 127 generates the test signal TMS in response to the designation of the write mask test mode.

Upon receipt of the test signal TMS from the test signal generation circuit 127, the data test circuit 128 writes and reads test data in the test mode in cooperation with the data control circuit 121 to be described later.

FIG. 2 is a diagram showing a connection relationship of the sense amplifiers SA, the local input/output lines LIO, the main input/output lines MIO, and the like in the semiconductor memory device of the present embodiment. In FIG. 2, each sense amplifier SA amplifies a potential difference of the pair of bit lines BL. The sense amplifier SA is connected to a pair of bit lines. The sense amplifier SA has an output which is connected to a pair of local input/output lines LIO via a pair of Y switches YS. That is, when the data read operation is performed, a signal read by the sense amplifier SA is supplied to the local input/output line LIO via the Y switch YS. The Y switch YS is turned on in response to a column address (Y address).

The pair of local input/output lines LIO common to a plurality of sense amplifiers are connected to input sides of the sub-amplifier SUB. The sub-amplifier SUB is provided for preventing that a read rate is decreased due to long lengths of the local input/output lines LIO and the main input/output lines MIO. Output of each sub-amplifier SUB is connected to a pair of main input/output lines MIO. The pair of main input/output lines MIO is connected to the data control circuit 121 which includes the write amplifier 121A and a read amplifier 121B. When data is read from the memory cell, the output of the sense amplifier SA is connected to the read amplifier 121B via the Y switch YS, the sub-amplifier SUB, and the main input/output line MIO.

The pair of local input/output lines LIO is connected to the pair of main input/output lines MIO via a pair of write switches WS. The write switch WS is a switch that is turned on when data is written to the memory cell. When the write amplifier 121A is activated, the write switch WS is turned on and thus the write amplifier 121A, the main input/output line MIO, and the local input/output line LIO are connected to each other.

When data is written as a normal operation, not the test mode, in the above-described configuration, write data amplified by the write amplifier 121A of the data control circuit 121 is transferred from the main input/output line MIO to the bit line BL through the local input/output line LIO. That is, "Read Amplifier: OFF, Write Amplifier: ON, Sub-amplifier: OFF, Write Switch: ON, and Y Switch: ON" are set. Thus, the data is written to a selected memory cell. Since a plurality of data terminals exist, a plurality of data to be written are supplied in parallel and are written to a plurality of selected memory cells.

In this case, a load is applied to the write amplifier 121A when the write amplifier 121A drives the main input/output line MIO, the local input/output line LIO, and the bit line BL. Only initially, the sense amplifier SA performs amplification after a potential difference is generated. Thus, the load to the write amplifier 121A is significantly heavy. However, the write amplifier 121A may be provided outside the memory array and can take a larger area than the sense amplifier SA. Therefore, it is possible to sufficiently increase the driving capability for a heavy load.

On the other hand, when the data write mode is performed as the test mode, data to be written is supplied to one of a plurality of data terminals. The data is written to a plurality of selected memory cells through a plurality of main input/output lines MIO and a plurality of local input/output lines LIO provided in correspondence with the plurality of data terminals. In order to write the data to the plurality of memory cells, it is necessary to supply the data to each of the plurality of main input/output lines MIO corresponding to the plurality of memory cells. This operation is performed by the data test circuit 128.

When data is read as a normal operation, not the test mode, a signal corresponding to data stored in a selected memory cell is read to the bit line BL, and is amplified by the sense amplifier SA. By this amplification, a refresh (restore) operation for the selected memory cell is performed. A column switch (a Y switch YS) corresponding to a column address is turned on, and the read data is transferred to the local input/output line LIO and is further amplified by the sub-amplifier SUB. At this time, the write switch WS is turned off and the write amplifier 121A is in an inactive state. The read data on the local input/output line LIO is transferred to the main input/output line MIO and amplified by the read amplifier 121B, and is output to the outside as a data signal. Thus, "Read Amplifier: ON, Write Amplifier: OFF, Sub-amplifier: ON, Write Switch: OFF, and Y Switch: ON" are set. This data read operation is performed in parallel in correspondence with a plurality of data terminals.

On the other hand, in the test data read mode as the test mode, data on each main input/output line MIO is compared with write data serving as an original thereof. The comparison result is output from one data terminal. The data test circuit 128 is responsible for this function.

In the write mask test mode, first, test data is written. This write operation is the same as in the test data write mode. As a result, the same data is written to a plurality of selected memory cells. An operation of writing the test data is the same as in the test data write mode, and the test data may be written using the same mode.

As described above in the test data write operation, "Read Amplifier: OFF, Write Amplifier: ON, Sub-amplifier: OFF, Write Switch: ON, and Y Switch: ON" are set.

Thereafter, the data read operation in the write mask test mode is performed. That is, a memory cell to which the test data is written is reselected. A signal corresponding to data stored in the cell appears on the bit line BL and is amplified by the sense amplifier SA. At this time, the write amplifier 121A is turned off in the data read operation, and the sub-amplifier SUB is turned off (deactivated) by the test signal TMS even in the data read operation. In addition, the column switch (the Y switch YS) corresponding to a column address is turned on in the data read operation, but the write switch WS is turned on (activated) even in the data read operation. That is, "Read Amplifier: ON, Write Amplifier: OFF, Sub-amplifier: OFF, Write Switch: ON, and Y Switch: ON" are set. Accordingly, the local input/output line LIO and the main input/output line MIO as well as the bit line BL are electrically connected to the sense amplifier SA. Thus, the load to the sense amplifier SA becomes significantly heavy. This significantly heavy load is applied to each of the sense amplifiers SA. Thus, if any sense amplifier SA electrically connected to the main input/output line MIO and the local input/output line LIO do not have a predetermined adequate driving capability, a potential of the bit line BL is not adequately amplified to the potential representing data stored in the selected memory cell. Thus, a refresh (restore) operation of the memory cell is not adequately performed in the write mask test mode. The local input/output line LIO and the main input/output line MIO are different in potential from the potential representing data stored in the selected memory cell.

As will be described later, this state is detected by the data test circuit 128 and is output as defective information. Thus, the sense amplifier is efficiently screened in a wafer P/W test in which a probe is not set up on a pad for a data mask.

Figure 3:
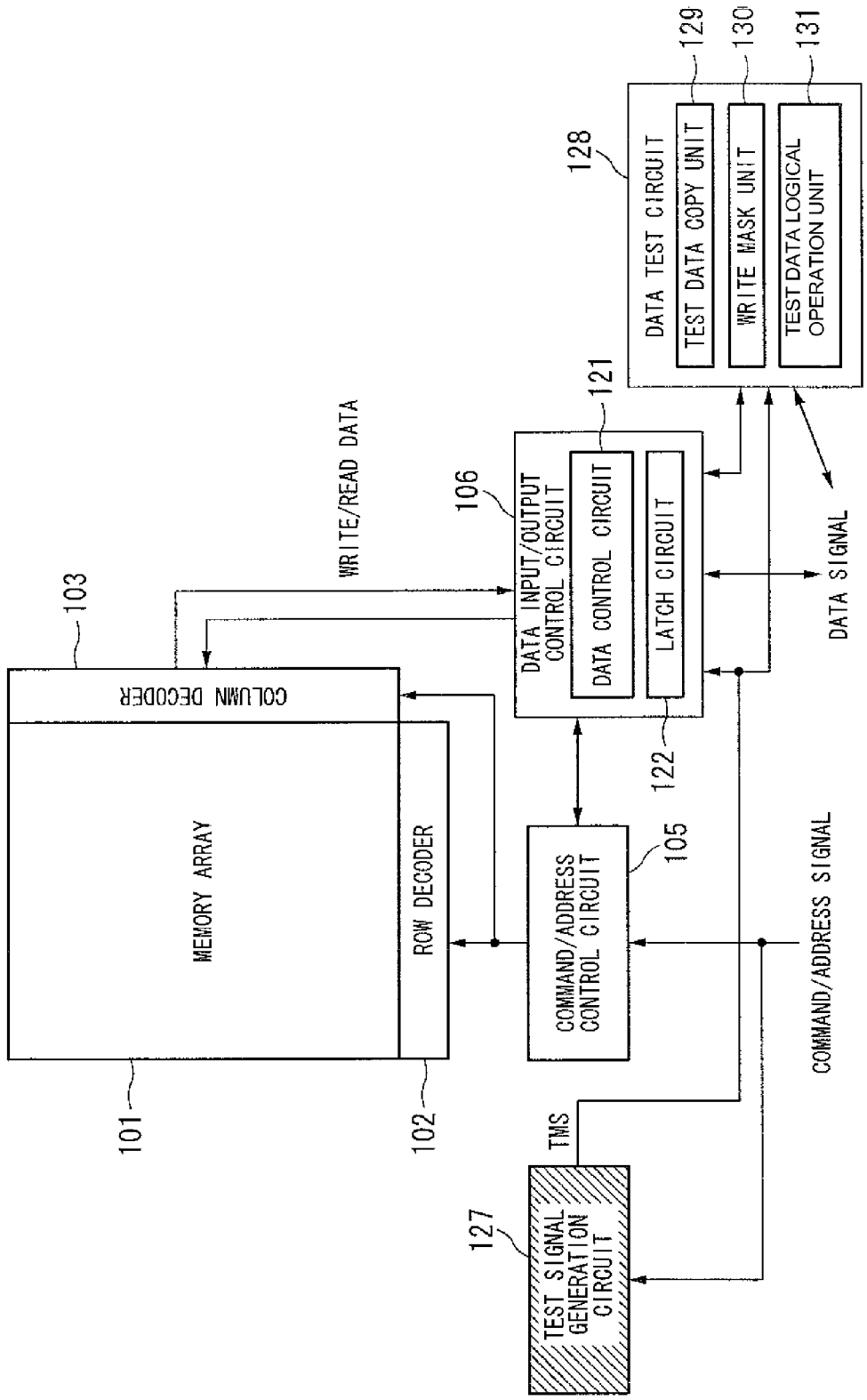
FIG. 3 is a diagram illustrating a schematic configuration in accordance with one embodiment of the present invention.

FIG. 3 is a diagram illustrating operations of the test signal generation circuit 127 and the data test circuit 128. In FIG. 3, a command/address control circuit 105 includes the command decoder 113, the control logic 114, the row address buffer 111, and the column address buffer 112 shown in FIG. 1. A data input/output control circuit 106 includes the data control circuit 121 and the latch circuit 122.

The data test circuit 128 includes a test data copy unit 129, a write mask unit 130, and a test data logical operation unit 131.

When test data is written to a memory cell, the test data copy unit 129 copies one data received from the latch circuit 122 to generate a plurality of data, and outputs the data to the data control circuit 121.

When the data read operation is performed in the write mask test mode, the write mask unit 130 deactivates the write amplifier 121A and the sub-amplifier SUB, and also turns on the write switch WS. Thereby, the sense amplifier SA is activated in a state in which its input/output nodes are connected to the bit line BL, the local input/output line LIO, and the main input/output line MIO. In this operation, if the load driving capability of the sense amplifier SA is low, the same data as data written to the memory cell is not read.

The test data logical operation unit 131 performs an exclusive OR (EXOR) logical operation on read data selected in the write mask test mode and data previously written to a corresponding selected memory in the write mask test. Then, the test data logical operation unit 131 outputs the operation result to the latch circuit 122. The output of the latch circuit 122 is output to the outside via one data terminal as a data signal.

Figure 4:
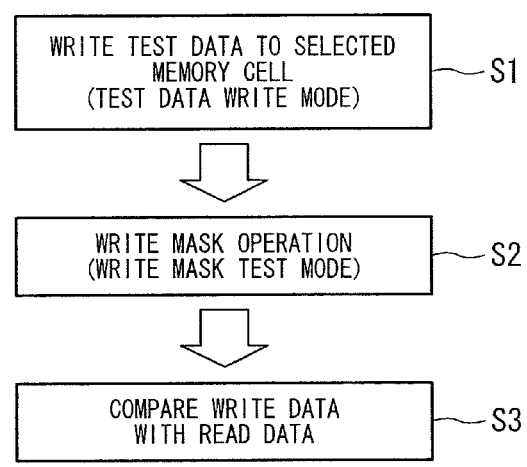
FIG. 4 is a flowchart showing a flow of processing in a test mode in accordance with one embodiment of the present invention.

FIG. 4 is a flowchart showing a flow of processes to be performed in the test mode (screening of the sense amplifier) using the data test circuit 128.

If the test signal TMS is supplied from the test signal generation circuit 127 to the data test circuit 128, the data test circuit 128 starts operation in the test data write mode. In the test data write mode, the same test data is written to a plurality of selected memory cells within the memory array 101 (step S1). Of course, as described above, test data may be written in the write mask test mode. In this step, if data of logic 0 is supplied as data to be written to one of a plurality of data terminals, the data of the logic 0 is written to the plurality of selected memory cells. Thus, the test data copy unit 129 copies one data of logic 0 received from the latch circuit 122 to generate a plurality of test data of logic 0, and outputs the data to the data control circuit 121. The write amplifier 121A supplies the plurality of copied data of logic 0 to each of the main input/output lines MIO. At this time, since the write switch WS is turned on and the Y switch YS is turned on, the data of logic 0 is written to each of the plurality of selected memory cells connected to the write amplifier 121A via the local input/output lines LIO and the bit lines BL. On the other hand, if data of logic 1 is supplied to one of the plurality of data terminals as data to be written, the data of logic 1 is written to each of the plurality of selected memory cells.

Next, the data test circuit 128 is shifted to the write mask test mode (step S2). In step S2, the plurality of memory cells to which the test data is written in step S1 are reselected. A signal corresponding to data stored in each cell appears on each bit line BL and is amplified by each sense amplifier SA. In this read operation, the write mask unit 130 deactivates the write amplifier 121A and the sub-amplifier SUB, and also turns on the write switch WS. Thereby, the plurality of sense amplifiers SA are connected to the plurality of selected memory cells via the bit lines BL, respectively. Each of the plurality of sense amplifiers SA is activated in a state in which their input/output nodes are connected to the bit lines BL, the local input/output lines LIO, and the main input/output lines MIO. In this operation, if the load driving capability of any sense amplifier SA of the plurality of sense amplifiers SA is low, the same data as data written to the memory cell is not read out to the local input/output lines LIO and the main input/output lines MIO which are connected to the sense amplifiers SA whose load driving capabilities are low. For example, if data of logic 0 is written in the previous step S1, the data of logic being 0 will appear on the main input/output line MIO connected to the sense amplifier SA whose load driving capability is sufficient.

However, if load driving capability of the sense amplifier SA is low even the data of logic 0 is written in the previous step S1, then the data of logic being 1 will appear on the main input/output line MIO connected to the sense amplifier SA. That is, although the same test data of logic 0 is written to the plurality of memory cells in the previous write operation, the same logic data will not appear on the plurality of main input/output lines MIO in the read operation in the write mask test mode if there is the sense amplifier SA whose load driving capability is low. Subsequently, each read amplifier 121B generates a signal by amplifying a potential difference of each main input/output line MIO. The test data logical operation unit 131 uses the signal in subsequent operation processing.

Subsequently, the read data of step S2 is compared with the write data of step S1 (step S3).

This comparison is performed by the test data logical operation unit 131. One of the data used in the comparison by the test data logical operation unit 131 is the test data input to the plurality of the memory cell. The test data is supplied to the data control circuit 121 from the data copy unit 129 and written to the plurality of the memory cell from the write amplifier 121A through the main input/output lines MIO, the local input/output lines LIO, and the bit lines BL in step S1. The other of the data used in the comparison by the test data logical operation unit 131 is the data that is read from the plurality of selected memory cells in step S2 and is supplied by the read amplifier 121B through the bit lines BL, the local input/output lines LIO, and the main input/output lines MIO. The test data logical operation unit 131 compares the write data with the read data by performing an EXOR logical operation on both the data. For example, in step S1, it is assumed that data of the logic 0 is written to the plurality of memory cells. If the load driving capabilities of the plurality of sense amplifiers SA connected to the plurality of memory cells via the bit lines BL are sufficient, read data all becomes the logic 0 in step S2. In this case, the test data logical operation unit 131 determines that the read data is the same as the write data. On the other hand, if there is a sense amplifier SA whose load driving capability is low among the plurality of sense amplifiers SA connected to the plurality of memory cells via the bit lines BL, at least one of the read data becomes the logic 1. In this case, the test data logical operation unit 131 determines that the read data is different from the write data. The test data logical operation unit 131 supplies the determination result to the latch circuit 122. The semiconductor memory device supplies the output of the latch circuit 122 from one of the plurality of data terminals to the outside of the semiconductor memory device through the DQ buffer 123 as the data signal DQ. In the external output, if the read data is the same as the test data upon writing, the logic 0 is output as information indicating the presence/absence of a defect in the sense amplifier SA. On the other hand, if the read data is different from the test data upon writing, the logic 1 is output.

If the logic 1 is output, it means that a corresponding address is a defective address. As a result, the defective address is stored in a fuse circuit of a redundancy circuit (not shown in FIG. 1 and the like), the defective sense amplifier is replaced by a redundancy cell and a sense amplifier for relief of the defective sense amplifier.

Here, a supplementary description is given of a correspondence relationship between the present embodiment and the present invention. In the present embodiment, a sense amplifier corresponds to the sense amplifier SA, a sub-amplifier corresponds to the sub-amplifier SUB, a read amplifier corresponds to the read amplifier 121B, and a write amplifier corresponds to the write amplifier 121A. In the present embodiment, a bit line corresponds to the bit line BL, a local input/output line corresponds to the local input/output line LIO, and a main input/output line corresponds to the main input/output line MIO. In the present embodiment, a column switch corresponds to the Y switch YS and a write switch corresponds to the write switch WS. In the present embodiment, a test circuit corresponds to the test signal generation circuit 127 and the data test circuit 128. A test data copy unit corresponds to the test data copy unit 129, a write mask unit corresponds to the write mask unit 130, and a test data logical operation unit corresponds to the test data logical operation unit 131.

As described with reference to the above-described embodiment, the semiconductor memory device includes the sense amplifier SA, the sub-amplifier SUB, the write amplifier 121A, and the test circuit (the test signal generation circuit 127 and the data test circuit 128). The sense amplifier SA amplifies a signal of the bit line BL to which a memory cell is connected. The sub-amplifier SUB amplifies a signal of the local input/output line LIO connected to the bit line BL via the Y switch YS. The write amplifier 121A drives the main input/output line MIO connected to the local input/output line LIO via the write switch WS on the basis of a data signal to be written. The test circuit (the test signal generation circuit 127 and the data test circuit 128) activates the sense amplifier SA, and deactivates both the sub-amplifier SUB and the write amplifier 121A, in the data read operation as the test mode, and further turns on both the Y switch YS and the write switch WS.

Thereby, in the test mode, the sense amplifier is connected the bit line BL, the local input/output line LIO, and the main input/output line MIO, namely, the load of the sense amplifier SA is increased. Whether or not the sense amplifier SA is defective can be determined. That is, a write mask operation is performed by adding the test circuit and providing the test mode, so that a defective sense amplifier (whose load driving capability is low) can be efficiently detected in a wafer state test (P/W process). In the P/W process, product yield can be improved along with quality improvement since an address including a defective sense amplifier is repaired using a redundancy circuit and the repaired semiconductor memory device is turned to a screening process after assembly.

In the above-described embodiment, the test circuit includes the test signal generation circuit 127 and the data test circuit 128. The test signal generation circuit 127 generates a test signal indicating that the test mode is performed by a predetermined signal supplied from outside of the semiconductor device. The data test circuit 128 performs the test mode according to the test signal generated by the test signal generation circuit 127. The data test circuit 128 includes the test data copy unit 129, the write mask unit 130, and the test data logical operation unit 131. The test data copy unit 129 copies data supplied from outside to generate a plurality of test data to be written when the test data is written to a plurality of selected memory cells by the write amplifier 121A. The write mask unit 130 deactivates the write amplifier 121A and the sub-amplifier SUB, turns on the write switch WS, and reads data from the plurality of selected memory cells, when the data is read as the test mode. The test data logical operation unit 131 compares write data with read data for each memory cell. Then, the test data logical operation unit 131 generates determination information indicating presence or absence of a defect in the sense amplifier SA on the basis of the comparison result.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

It is apparent that the present invention is not limited to the above embodiments, but may be modified and changed without departing from the scope and spirit of the invention.

What is claimed is:
1. A semiconductor device comprising:
a sense amplifier amplifying signal on a bit line;
a column switch between the bit line and a local input-output line;
a sub-amplifier amplifying signal on the local input-output line;
a write switch between the local input-output line and a main input-output line;
a write amplifier amplifying write data and supplying the amplified write data to the main input-output line when data write operation is performed; and
a test circuit which activates the sense amplifier while the test circuit deactivating the sub-amplifier and the write amplifier, the test circuit placing the column switch and the write switch in a conductive state, when a data read operation is performed in a test mode.

2. The semiconductor device according to claim 1, wherein the test circuit comprises:
   a test signal generation circuit generating a test signal for performing a test operation in the test mode; and
   a data test circuit performing the test operation in the test mode in response to the test signal.

3. The semiconductor device according to claim 2, wherein the data test circuit comprises:
   a test data copy unit which copies input data to generate a plurality of write test data when the write amplifier stores the test data to selected memory cells;
   a write mask unit which deactivates the write amplifier and the sub-amplifier, the write mask unit placing the write switch in conductive state, when the data read operation is performed in test mode; and
   a test data logical operation unit which compares write data in each of the selected memory cells and read data from the each memory cell, the test data logical operation unit generating determination information indicating whether or not the sense amplifier is defective, based on a result of comparing the read data to the write data.

4. The semiconductor device according to claim 1, further comprising:
   a plurality of data terminals; and
   a write mask unit masking a part of the plurality of data terminals while the write mask unit allowing the write amplifier to store data to the rest of the plurality of data terminals.

5. The semiconductor device according to claim 4, further comprising:
   a plurality of the write amplifiers corresponding to the plurality of data terminals;
   a plurality of the main input-output lines corresponding to the plurality of the write amplifiers;
   plural sets of the local input-output lines, each of the plural sets comprising a plurality of the local input-output lines, the plural sets corresponding to the plurality of the main input-output lines; and
   a plurality of the sense amplifiers corresponding to the plural sets.

6. The semiconductor device according to claim 5, wherein the test circuit deactivates the plurality of the write amplifiers in test mode while the test circuit controls selected sense amplifiers to drive the plurality of main input-output lines and the plurality of local input-output lines electrically connected to the plurality of main input-output lines.

7. The semiconductor device according to claim 6, wherein the selected sense amplifiers drives the plurality of main input-output lines and the plurality of local input-output lines, using data from a plurality of the memory cells.

8. The semiconductor device according to claim 5, wherein a plurality of the sub-amplifiers correspond to the plurality of local input-output lines, and
   wherein the test circuit deactivates each of the plurality of sub-amplifiers in the test mode.

9. The semiconductor device according to claim 4, further comprising:
   a plurality of the write switches,
   wherein the test circuit deactivates the write amplifiers corresponding to the part of the plurality of data terminals which is masked by the write mask unit, and
   wherein the test circuit places, in non-conductive state, a part of the plurality of write switches, the part of the plurality of write switches correspond to the part of the plurality of data terminals which is masked by the write mask unit.

10. A method of testing a semiconductor device, comprising: performing a read operation of the semiconductor device in a test mode, performing the read operation comprising:
    activating a first sense amplifier amplifying signal on a bit line;
    deactivating a sub-amplifier amplifying signal on a local input-output line that is connected through a column switch to the bit line;
    deactivating a write amplifier driving a main input-output line based on a write data signal, the main input-output line being connected through a write switch to the local input-output line; and
    placing the column switch and the write switch in a conductive state.

11. The method according to claim 10, wherein performing the test mode further comprises:
    copying external input data to generate a plurality of write test data when the write amplifier stores the test data to selected memory cells;
    deactivating the write amplifier and the sub-amplifier in data read operation in test mode;
    placing the write switch in conductive state;
    reading out data from the selected memory cells; and
    comparing read data to write data, the read data having been read out of each of the selected memory cells after the write data having been stored into the each memory cell.

12. The method according to claim 11, wherein performing the test mode comprises:
    generating determination information indicating whether or not the first sense amplifier is defective, based on a result of comparing the read data to the write data.

13. The method according to claim 12, further comprising:
    storing a defective address in a fuse circuit of a redundancy circuit when the first sense amplifier is determined as defective; and
    replacing the first sense amplifier with a redundancy cell and a second sense amplifier.

14. The method according to claim 10, wherein the test mode is performed in a state where the semiconductor device is formed on a wafer.

15. A method of testing a semiconductor device, the method comprising:
    writing test data to a memory cell, the memory cell being coupled to a bit line, a main input-output line, and a local input-output line;
    reading out data from the memory cell to the bit line;
    allowing a first sense amplifier to amplify the data on the bit line while the first sense amplifier being electrically coupled to the bit line, the main input-output line, and the local input-output line; and
    comparing the data amplified by the first sense amplifier to a reference data describing the test data.

16. The method according to claim 15, further comprising:
    generating determination information indicating whether or not the first sense amplifier is defective, based on a result of comparing the data amplified by the first sense amplifier to the reference data describing the test data.

17. The method according to claim 16, further comprising:
    storing a defective address in a fuse circuit of a redundancy circuit when the first sense amplifier is determined as defective; and
    replacing the first sense amplifier with a redundancy cell and a second sense amplifier.

18. The method according to claim 15, wherein a write switch is placed in conductive state and a sub-amplifier is placed in non-conductive state when amplifying the data on the bit line by the first sense amplifier,
   wherein the sub-amplifier amplifies signal of the local input-output line,
   wherein the main input-output line is connected to the local input-output line through the write switch.

19. The method according to claim 15, wherein the test mode is performed in a state where the semiconductor device is a wafer.

20. The method according to claim 15, wherein amplifying the data on the bit line by the first sense amplifier performs a refresh operation of the memory cell.

* * * * *

UNITED STATES PATENT AND TRADEMARK OFFICE
CERTIFICATE OF CORRECTION

PATENT NO. : 8,369,167 B2
APPLICATION NO. : 12/984217
DATED : February 5, 2013
INVENTOR(S) : Tomohiro Sawada It is certified that error appears in the above-identified patent and that said Letters Patent is hereby corrected as shown below:

In the Claims:

Column 13, lines 25-31, claim 4 should read:

4. The semiconductor device according to claim 1, further comprising:
    a plurality of data terminals; and
    a write mask unit masking data at a part of the plurality of data terminals while the write mask unite allowing the write amplifier to store data ~~to~~ at the rest of the plurality of data terminals.

Column 13, lines 51-54, claim 7 should read:

7. The semiconductor device according to claim 6, wherein the selected sense amplifiers drives the plurality of main input-output line and the plurality of local input-output lines, using data from a plurality of ~~the~~ memory cells.

Signed and Sealed this
Fourth Day of June, 2013

Teresa Stanek Rea
*Acting Director of the United States Patent and Trademark Office*